United States Patent
Hanna et al.

(10) Patent No.: US 8,344,382 B2
(45) Date of Patent: Jan. 1, 2013

(54) SEMICONDUCTOR DEVICE, MANUFACTURING METHOD THEREOF, AND DISPLAY APPARATUS USING THE SEMICONDUCTOR DEVICE

(75) Inventors: Junichi Hanna, Mitaka (JP); Isao Suzumura, Tokyo (JP); Mieko Matsumura, Kokubunji (JP); Mutsuko Hatano, Kokubunji (JP); Kenichi Onisawa, Hitachinaka (JP); Masatoshi Wakagi, Hitachinaka (JP); Etsuko Nishimura, Hitachiota (JP); Akiko Kagatsume, Tsukuba (JP)

(73) Assignees: Hitachi, Ltd., Tokyo (JP); Tokyo Institute of Technology, Tokyo (JP)

( * ) Notice: Subject to any disclaimer, the term of this patent is extended or adjusted under 35 U.S.C. 154(b) by 31 days.

(21) Appl. No.: 13/001,428

(22) PCT Filed: Jun. 26, 2009

(86) PCT No.: PCT/JP2009/061687
§ 371 (c)(1),
(2), (4) Date: Dec. 26, 2010

(87) PCT Pub. No.: WO2009/157531
PCT Pub. Date: Dec. 30, 2009

(65) Prior Publication Data
US 2011/0108841 A1    May 12, 2011

(30) Foreign Application Priority Data

Jun. 27, 2008    (JP) ................................ 2008-168226

(51) Int. Cl.
*H01L 29/04*    (2006.01)
*H01L 21/20*    (2006.01)

(52) U.S. Cl. ................ 257/59; 257/57; 257/66; 257/72; 257/E29.003; 257/E21.09; 438/482; 438/488

(58) Field of Classification Search .................... 257/59, 257/66, 57, 72, E29.003, E21.09; 438/482, 438/488
See application file for complete search history.

(56) References Cited

U.S. PATENT DOCUMENTS

| 5,827,773 | A | 10/1998 | Voutsas |
| 2008/0258148 | A1 | 10/2008 | Wakagi et al. |

FOREIGN PATENT DOCUMENTS

| JP | 2000-232065 A | 8/2000 |
| JP | 2002-299264 A | 10/2002 |
| JP | 2007-013194 A | 1/2007 |
| JP | 2007-165921 A | 6/2007 |
| JP | 2008-235658 A | 10/2008 |
| JP | 2009-088106 A | 4/2009 |

OTHER PUBLICATIONS

Translation of JP 2007-165921.*
Translation of JP 2002-299264.*

* cited by examiner

*Primary Examiner* — Benjamin Sandvik
*Assistant Examiner* — Whitney T Moore
(74) *Attorney, Agent, or Firm* — Miles and Stockbridge P.C.

(57) ABSTRACT

Provided is a method of promoting a deposition of semiconductor crystal nuclei on an insulating film such as a silicon oxide film even at a low temperature of 450° C. or lower in a reactive thermal CVD method. As one means thereof, a first semiconductor film is formed on an insulating substrate, and then semiconductor crystal nuclei are formed on parts of the first semiconductor film and simultaneously the first semiconductor film other than that in forming regions of the semiconductor crystal nuclei and their peripheries is removed by etching. Thereafter, a second semiconductor film is formed with using the semiconductor crystal nuclei as seeds.

20 Claims, 12 Drawing Sheets

US 8,344,382 B2

SEMICONDUCTOR DEVICE, MANUFACTURING METHOD THEREOF, AND DISPLAY APPARATUS USING THE SEMICONDUCTOR DEVICE

TECHNICAL FIELD

The present invention relates to a semiconductor device typified by a thin-film transistor suitable for an organic EL display apparatus, a liquid crystal display apparatus and others, a manufacturing method thereof, and a display apparatus using the semiconductor device.

BACKGROUND ART

In mobile information terminals such as a mobile phone and PDA, the demands for the reduction in weight and thickness and the improvement in display quality in the display apparatus thereof have been increasing in recent years, and therefore, a middle or small size panel of an organic EL display apparatus (hereinafter, also referred to as OLED) having the characteristics of self light emission, no backlight and high contrast ratio has been gradually adopted. Furthermore, the development of a large size OLED panel as a display apparatus for television has been currently activated because the high response speed thereof is suitable for the movie display.

In the OLED panel, the variation in luminance of each pixel formed on a thin-film transistor substrate has to be suppressed in order to improve the image quality. Accordingly, it is indispensable to strictly control the current flowing in a light emission layer of the organic EL element (OLED element) constituting the OLED, and the TFT with small variation in threshold voltage is strongly demanded as the driving TFT provided for each pixel. Also, the improvement in mobility of the TFT is required for the reduction in the power consumption of the OLED panel.

The same is true of the liquid crystal display apparatus (hereinafter, also referred to as LCD). The LCD is formed by sealing liquid crystal between each pixel electrode formed on a thin-film transistor substrate and a color filter substrate. The improvement in mobility of the TFT is required for the reduction in the power consumption and the higher definition of the LCD.

For these reasons, the TFT using a low-temperature polycrystalline silicon film formed by the laser annealing method is used in many of the existing middle or small size panels. However, the formation of the polycrystalline silicon TFT by this method is unsuitable for the large size panel. This is because, since there is a limit on the area of an amorphous-silicon film that can be crystallized by the laser irradiation at one time, the laser annealing process has to be repeatedly carried out for forming the same TFTs on the large substrate, which results in the increase in the process cost.

In the meantime, the polycrystalline silicon film can be formed by the method other than the laser annealing. For example, it can be formed by heating the substrate to about 600° C., which is higher than the crystallization temperature of Si, by the thermal chemical vapor deposition (CVD) method. However, since the glass substrate whose softening temperature is 600° C. or lower is used for the large size OLED panel, the application of the thermal CVD method is difficult. Furthermore, although the polycrystalline silicon film can be formed at a lower temperature by the plasma enhanced chemical vapor deposition method, since the incubation layer containing the amorphous tissue tends to be formed on an insulating film in the initial stage of the deposition, this deposition method is unsuitable for the application to the bottom-gate TFT in which a channel is formed on the substrate side.

For the reasons above, the technology capable of forming a polycrystalline silicon film directly on an insulating substrate at a low temperature has been required for the driving TFT of a large size panel, and the technology called reactive thermal chemical vapor deposition has been recently proposed.

In the reactive thermal chemical vapor deposition method, disilane ($Si_2H_6$) and germanium tetrafluoride ($GeF_4$) are used as source gases, and the polycrystalline silicon germanium (SiGe) film can be formed at a high deposition rate at a temperature lower than the deposition temperature of the usual thermal CVD method by the hydrogen abstraction reaction of fluorine (F) in $GeF_4$ from $Si_2H_6$. Since the source gases can be reacted mainly on the substrate surface in this method, the semiconductor crystal nuclei can be directly deposited on a large-area insulating substrate without the amorphous texture, and further, if the crystal growth is performed from the crystal nuclei by using the various types of deposition technologies, the polycrystalline semiconductor film excellent in crystallinity can be formed at a low temperature.

Furthermore, it also has the advantage that the preferred orientation of the polycrystal to be grown can be set to, for example, (111), (110) and (100) by selecting the deposition conditions of the initial semiconductor crystal nuclei and the thickness of the formed initial semiconductor crystal nuclei.

The Patent Document 1 describes a conventional example of the deposition using the reactive thermal CVD method. The example of the deposition of a polycrystalline SiGe film described in this Patent Document 1 will be shown below. In the first example described in the Patent Document 1, with using SiO formed on a silicon wafer as a substrate, $GeF_4$ and $Si_2H_6$ are supplied at 2.7 sccm and 20 sccm and He for dilution is supplied at 500 sccm to a reaction container and deposited at 425° C. for 20 minutes while changing the pressure from 15 to 50 torr. As a result, the semiconductor crystal nuclei are produced at the density of about $10^5$ to $10^6$ cm$^{-2}$ at 15 torr, about $10^7$ to $10^8$ cm$^{-2}$ at 20 torr, about $10^8$ to $10^9$ cm$^{-2}$ at 25 torr and about $10^9$ to $10^{10}$ cm$^{-2}$ at 50 torr.

Next, on the semiconductor crystal nuclei formed on the substrate, the growth is continued while reducing the growth temperature to 375° C. In this manner, the SiGe polycrystalline film with high crystallinity is formed. Also, in the second example described in the Patent Document 1, after the deposition of the semiconductor crystal nuclei, silane, silane fluoride and hydrogen are supplied at the flow rate of 2 sccm, 98 sccm and 50 sccm, respectively, and the Si polycrystalline film is formed at 400° C. by the glow discharge decomposition method at the pressure of 1 torr.

Furthermore, in the third example described in the Patent Document 1, after the deposition of the semiconductor crystal nuclei, the Si polycrystalline film is formed at 300° C. by the radio-frequency (rf) glow discharge method using the hydrogen-diluted silane (2%).

PRIOR ART DOCUMENT

Patent Document

Patent Document 1: Japanese Patent Application Laid-Open Publication No. 2007-13194

DISCLOSURE OF THE INVENTION

Problems to be Solved by the Invention

For the improvement in the characteristics of the TFT using a polycrystalline SiGe film as a semiconductor layer, the lattice defects to be a trap are desirably terminated by H. On the other hand, the hydrogen abstraction occurs in the reaction between $Si_2H_6$ and $GeF_4$ in the reactive thermal CVD method. Therefore, in order to increase the concentration of hydrogen remaining in the polycrystalline SiGe film formed by the reactive thermal CVD method, the desorption of the H atoms from Si and Ge atoms has to be suppressed.

However, when the SiGe crystal nuclei are formed by the reactive thermal CVD method using $Si_2H_6$ and $GeF_4$, 425° C. is required as the substrate temperature like in the conventional example, and since the high deposition rate is desirable for the improvement in the throughput of the nuclei deposition, 450° C. or higher is required in practical use. However, 450° C. is the temperature at which the desorption of H atoms from Si atoms readily occurs. Therefore, the hydrogen concentration tends to be reduced in the film grown on the insulating film.

Furthermore, the temperature of 450° C. is lower than the softening temperature of the glass substrate, but is equal to or higher than the temperature at which the hillock and void are formed in a metal film. Therefore, in the bottom-gate TFT, the metal film for gate electrode disposed below an insulating film is damaged when a semiconductor layer is formed on the insulating film, and the problem of the increase in the resistance of metal line occurs.

An object of the present invention is to provide a method capable of promoting the deposition of the semiconductor crystal nuclei on an insulating film such as a silicon oxide film even at a low temperature of 450° C. or lower in the reactive thermal CVD method.

Means for Solving the Problems

Specifically, a semiconductor film is formed in advance as a base layer before the deposition by the reactive thermal CVD method. This semiconductor film can be etched by halogen atoms contained in the supplied gas. Therefore, the manufacturing method of the semiconductor device according to the invention of the present application is characterized by performing at least a first step of forming a first semiconductor film on an insulating substrate, a second step of forming semiconductor crystal nuclei on parts of the first semiconductor film and simultaneously removing the first semiconductor film other than that in forming regions of the semiconductor crystal nuclei and their peripheries by etching, and a third step of forming a second semiconductor film with using the semiconductor crystal nuclei as seeds.

Also, the manufacturing method is characterized in that, since the film can be formed at a low temperature of 450° C. or lower in the first step, an amorphous silicon film or a microcrystalline silicon film is formed as the first semiconductor film.

Also, the manufacturing method is characterized in that silicon germanium crystal nuclei are formed as the semiconductor crystal nuclei by the reactive thermal CVD method in which silanes and halogenated germanium are supplied as source gases and the deposition temperature is set to 450° C. or lower in order to achieve the good crystallinity in the second step, and the first semiconductor film is etched by the halogen atoms and halide produced from the halogenated germanium.

Furthermore, a silicon film is formed on a semiconductor polycrystalline film such as a silicon film and an insulating film such as a silicon oxide film and a silicon nitride film regardless of an underlying base material, but a silicon germanium film is hard to be formed on an insulating film although the crystal growth thereof occurs on a semiconductor polycrystalline film. Therefore, the manufacturing method is characterized in that, in order to selectively grow a polycrystalline film on the semiconductor crystal nuclei and their peripheries, in the third step, a polycrystalline silicon germanium film is formed as the second semiconductor film by the reactive thermal CVD method in which silanes and halogenated germanium are supplied as the source gases and the deposition temperature is set to 450° C. or lower.

Alternatively, in the third step, a polycrystalline silicon film can be formed as the second semiconductor film. The thermal CVD method may be adopted as the deposition method, but the plasma enhanced CVD method is more preferable for the following reasons. The deposition rate of the reactive thermal CVD method is as low as about 50 nm per minute even when the substrate temperature is 500° C., but the deposition rate as high as about 200 nm per minute at about 250° C. can be achieved in the deposition of an amorphous silicon film by the plasma enhanced CVD method. Since the polycrystalline silicon film is deposited on the semiconductor crystal nuclei, the deposition thereof is possible under the deposition conditions of the amorphous silicon film by the plasma enhanced CVD method. Also, it is desirable to perform a fourth step of forming a third semiconductor film on the second semiconductor film.

Furthermore, it is preferable that, in order to improve the throughput of the deposition in accordance with the characteristics required in the TFT, a silicon film made of amorphous, microcrystal or polycrystal is formed by the plasma enhanced CVD method in the fourth step.

Also, a TFT of the invention of the present application is characterized by comprising a semiconductor film, a source electrode, a drain electrode and a gate electrode on an insulating substrate, and the semiconductor film is made up of first semiconductor films discretely formed on parts of an insulating film, semiconductor crystal nuclei formed on the first semiconductor films and their peripheries and a second semiconductor film formed on the semiconductor crystal nuclei.

In addition, the first semiconductor films are preferably amorphous silicon films or microcrystalline silicon films because they can be formed at a low temperature by using, for example, the plasma enhanced CVD method. Further, the selection of these film is preferable also because the etching rate by the halogen atoms is sufficiently high when the temperature is about 100° C. or higher.

Furthermore, it is preferable that the semiconductor crystal nuclei are silicon germanium crystal nuclei because they are formed at a low temperature of 450° C. or lower on the insulating film.

Also, it is more preferable that the second semiconductor film is a polycrystalline silicon film because the performance improvement of the TFT can be achieved. Further, it is more preferable that the second semiconductor film is a polycrystalline silicon germanium film because it is selectively crystal-grown on the semiconductor crystal nuclei and their peripheries.

Also, the TFT of the invention of the present application is preferably comprises a third semiconductor film on the second semiconductor film.

Furthermore, in order to achieve a TFT with good off-current characteristics by reducing the off-current in the semiconductor layer, the third semiconductor film is preferably made of an amorphous silicon film, a microcrystalline silicon film or a polycrystalline silicon film.

Also, in order to provide a high-quality and long-life display apparatus at low cost, it is preferable to apply the TFT of the invention of the present application to an organic EL driving.

Further, in order to provide a high-definition display apparatus at low cost, it is preferable to apply the TFT of the invention of the present application to a liquid crystal display apparatus.

Effects of the Invention

According to the manufacturing method of the semiconductor device of the invention of the present application, the first semiconductor film is deposited on the underlying base insulating film when a polycrystalline film applied as a semiconductor layer of a TFT is directly grown and formed. Therefore, since semiconductor crystal nuclei are easily formed on the semiconductor film compared with on the insulating film, the reduction in the deposition temperature can be achieved. As a result, the hydrogen termination of the lattice defects can be maintained and the resistance increase in the metal film for gate electrode can be suppressed, and the improvement of the TFT characteristics can be achieved.

BRIEF DESCRIPTIONS OF THE DRAWINGS

BEST MODE FOR CARRYING OUT THE INVENTION

Hereinafter, best modes for carrying out the present invention will be described in detail with reference to the drawings of the embodiments.

First Embodiment

Figure 1:
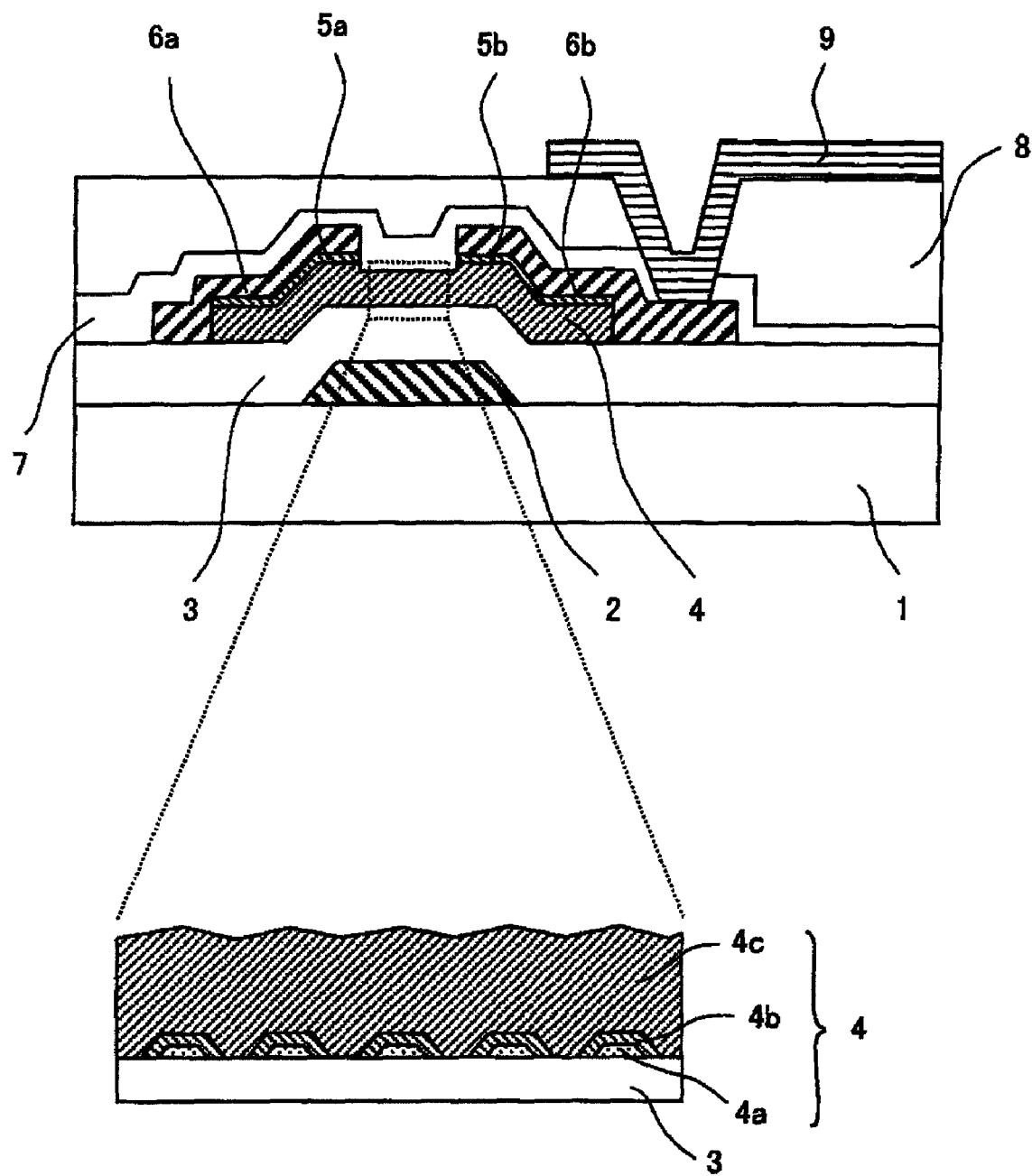
FIG. 1 is a cross-sectional structural view of the bottom-gate TFT for describing the first embodiment of the semiconductor device formed by using the manufacturing method of the semiconductor device according to the present invention.

FIG. 1 is a cross-sectional view of the principal part for describing the first embodiment of the semiconductor device fabricated by using the manufacturing method of the semiconductor device according to the present invention. The semiconductor device shown in FIG. 1 is a bottom-gate TFT formed on an insulating substrate 1. This TFT is roughly made up of a semiconductor film 4 provided on a gate electrode 2 and a source electrode wiring 6a and a drain electrode wiring 6b separated by a channel and disposed on the semiconductor film 4. This structure will be described below in detail.

A gate insulating film 3 is formed on the insulating substrate 1 having a gate electrode wiring 2 processed on a part of a surface thereof, and the semiconductor film 4 is formed in a TFT formation region of the gate insulating film 3. As shown in an enlarged view of a channel portion, this semiconductor film 4 is made up of semiconductor film portions 4a formed on the gate insulating film 3 and made of, for example, amorphous silicon, semiconductor crystal nuclei 4b formed on the semiconductor film portions 4a and made of, for example, SiGe and a semiconductor film 4c formed on the semiconductor crystal nuclei 4b and made of, for example, SiGe.

Furthermore, an $n^+$ silicon film 5a of a source region and a source electrode wiring 6a are formed on one end of the semiconductor film 4, and an $n^+$ silicon film 5b of a drain region and a drain electrode wiring 6b are formed on the other end of the semiconductor film 4. A passivation insulating film 7 and an interlayer insulating film 8 are further deposited on the source electrode wiring 6a and the drain electrode wiring 6b. Furthermore, a pixel electrode 9 connected to the drain electrode wiring 6b is formed.

Next, the manufacturing process of the TFT having the structure shown in FIG. 1 will be described with reference to FIG. 2A to FIG. 2E. Note that these drawings show the main part of the manufacturing process. First, the gate electrode wiring 2 is formed on the insulating substrate 1 made of, for example, glass. As the wiring material, a metal such as Nb, Mo, W, Ta, Cr, Ti, Fe, Ni or Co, alloy of these metals and a stacked film of these metals can be used. Alternatively, since the upper limit temperature of the process can be decreased, a low-resistance metal such as Al or Cu can also be used. These films can be formed by the sputtering method. In the present embodiment, an AlNd alloy film is used. The film thickness is set to 200 nm. Next, the film is processed to the gate electrode wiring pattern 2 by using the photolithography.

Thereafter, the gate insulating film 3 is formed on the substrate. As the insulating film material, SiO, SiN, SiON or the like can be used. These films can be formed by the plasma enhanced CVD method or the sputtering method. Alternatively, the plasma oxidation and the photooxidation may be used concurrently. In the present embodiment, an SiO film formed by the plasma enhanced CVD method using tetraethoxysilane (TEOS) under the standard conditions is formed to have a thickness of 100 nm. Through the process described above, the structure shown in FIG. 2A is obtained.

Next, the semiconductor film 4a is deposited on the gate insulating film 3. For example, an amorphous silicon film or a microcrystalline silicon film is preferably used as the semiconductor film 4a. The microcrystalline film mentioned here indicates a film in which crystalline tissue and amorphous tissue are mixed and the crystal grain size is about 1 to 30 nm. The semiconductor film 4a can be formed by, for example, the plasma enhanced CVD method. Any temperature higher than the room temperature may be used as the deposition temperature, but since the deposition rate higher than a certain level has to be secured for the improvement of the throughput of the TFT manufacture, the deposition temperature is desirably 200° C. or higher, and it is preferably 450° C. or lower for suppressing the formation of the hillock and void in the gate electrode wiring 2.

The thickness of the semiconductor film 4a is preferably 50 nm or smaller because it is desirable that the semiconductor film 4a is removed other than that below the semiconductor crystal nuclei 4b and their peripheries in the subsequent deposition of the semiconductor crystal nuclei 4b. Also, in order to terminate the dangling bonds of the Si atoms caused by the increase in the off-current of the TFT, the amorphous silicon film and the microcrystalline silicon film desirably contain hydrogen of $1 \times 10^{19}$ cm$^{-3}$ or more to $1 \times 10^{22}$ cm$^{-3}$ or less. From the foregoing, the hydrogenated amorphous silicon film can be formed by using, for example, the plasma frequency of 13.56 MHz, supplying the hydrogen-diluted 10% monosilane ($SiH_4$) at 100 sccm, and setting the substrate temperature at 200° C. and the gas pressure at 133 Pa. Furthermore, in the deposition of the microcrystalline silicon film, for example, the conditions of the plasma frequency of 13.56 MHz, the ratio of fluoride-silane ($SiF_4$) and hydrogen ($H_2$) of 3:1, the substrate temperature of 250° C. and the gas pressure of 40 Pa can be used. Through the process described above, the structure shown in FIG. 2B is obtained.

Thereafter, the semiconductor crystal nuclei 4b and the semiconductor film 4c are formed on the semiconductor film 4a. The process of forming these films in the region enclosed by dotted lines of FIG. 2B will be described with reference to FIG. 2C.

The reactive thermal CVD method is used for forming the semiconductor crystal nuclei 4b, and SiGe is preferably selected as the material thereof. In this case, since the reactive thermal CVD method utilizes the redox reaction by the semiconductor hydrogenated gas and the halogenated gas, as the source gases to be supplied, $Si_nH_{2n+2}$ (n>1) may be used as the semiconductor hydrogenated gas and $GeF_4$ may be used as the halogenated gas. However, since not only the redox reaction but also the thermal decomposition of the source gas affects the deposition by the reactive thermal CVD method, the use of $Si_2H_6$ having the low thermal decomposition temperature is desirable for achieving the deposition at a lower temperature.

Also, as the combination of the semiconductor hydrogenated gas and the halogenated gas, the combination of the silanes or germanes ($GeH_4$) and $F_2$, the combination of $GeH_4$ and $SiF_4$ and others are also possible, but the combination of $Si_2H_6$ and $GeF_4$ is preferable when the low nucleus deposition temperature, the nucleus deposition rate equal to or higher than a predetermined level and the usage cost of the gases are taken into consideration. The ratio of gas flow of $Si_2H_6$ and $GeF_4$ may be set to, for example, 1:0.005 to 2.

Furthermore, in the reactive thermal CVD method, for securing the deposition pressure of about 10 Pa to 10000 Pa in order to produce the crystal nuclei at a deposition rate equal to or higher than a predetermined level, carrier gas such as He, Ar or $H_2$ is introduced during the deposition. When He is selected out of these gases, it is preferable that the ratio of gas flow of $Si_2H_6$ and He is set to, for example, 1:10 to 5000. Also, it is preferable that the deposition temperature is set to 300° C., at which the nucleus deposition occurs, or higher and also set to 450° C. or lower in order to suppress the desorption of H from the crystal nuclei.

From the foregoing, when the deposition by the reactive thermal CVD method is started on the semiconductor film 4a made of, for example, an amorphous silicon film under the deposition conditions of the $Si_2H_6$ flow rate of 0.5 sccm, the $GeF_4$ flow rate of 0.5 sccm, the He flow rate of 1000 sccm, the substrate temperature of 400° C. and the total pressure of 1300 Pa, the initial formation of the crystal nuclei made of SiGe occurs on parts of the surface of the semiconductor film 4a. Furthermore, the crystallization occurs from the surface in a part of the amorphous silicon film by the supply of $GeF_4$.

Figure 2A:
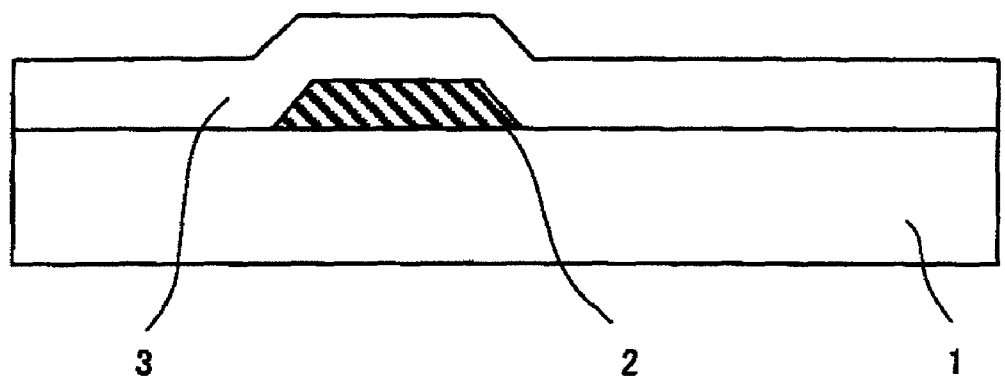
FIG. 2A is a partially enlarged cross-sectional view showing the manufacturing method of the TFT shown in FIG. 1 in order of processes.
Figure 2B:
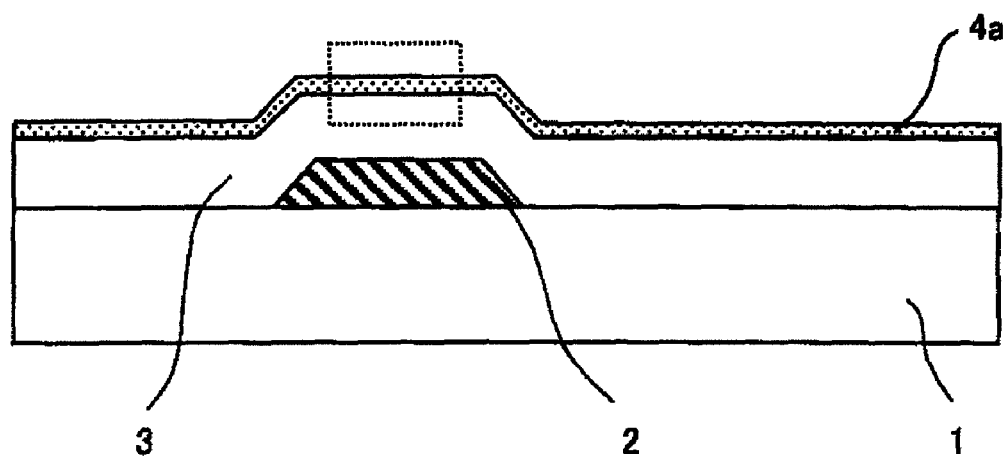
FIG. 2B is a partially enlarged cross-sectional view showing the process continued from FIG. 2A in the manufacturing method of the TFT shown in FIG. 1.
Figure 2C:
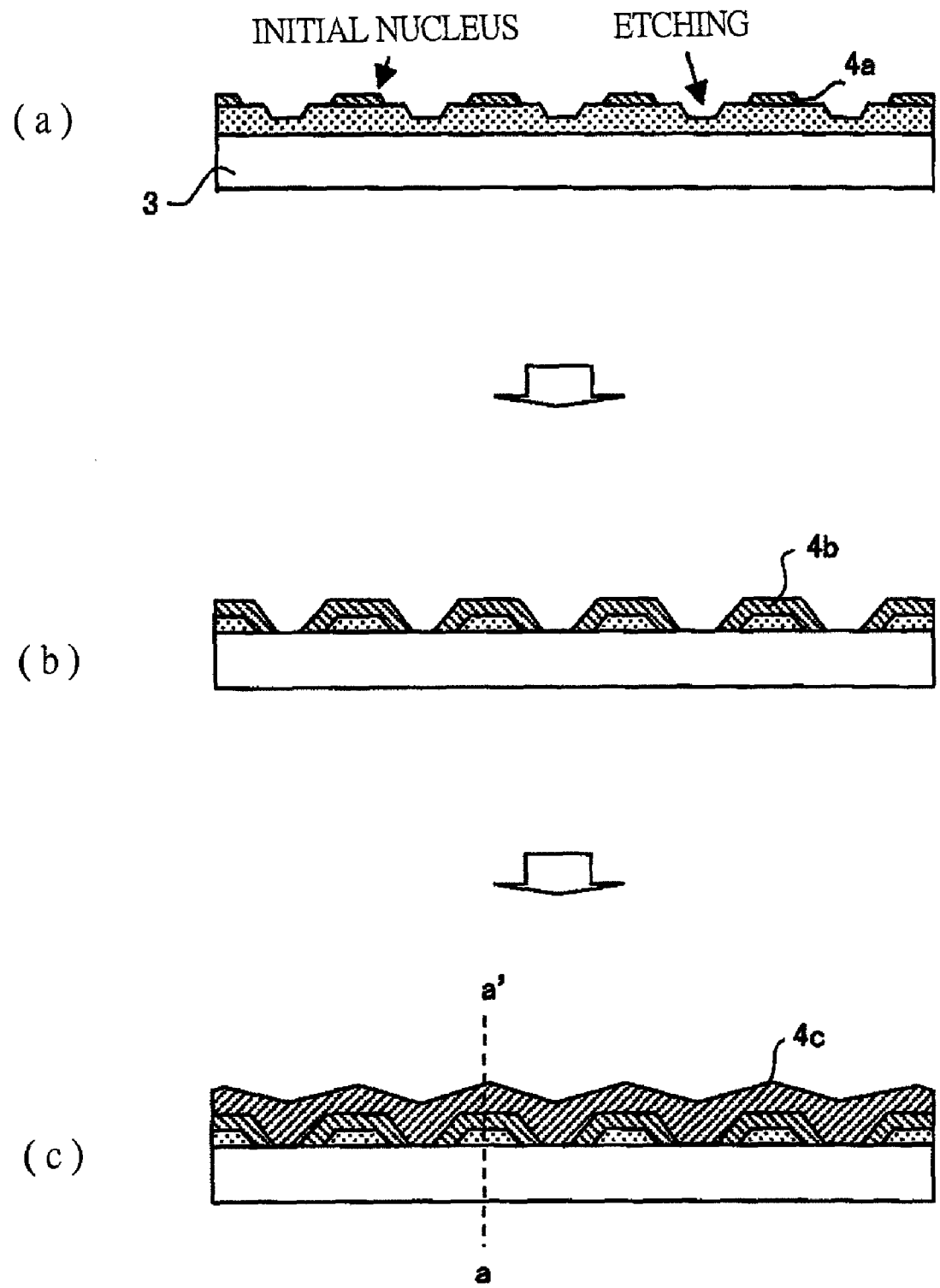
FIG. 2C is a partially enlarged cross-sectional view showing the process continued from FIG. 2B in the manufacturing method of the TFT shown in FIG. 1.
Figure 2D:
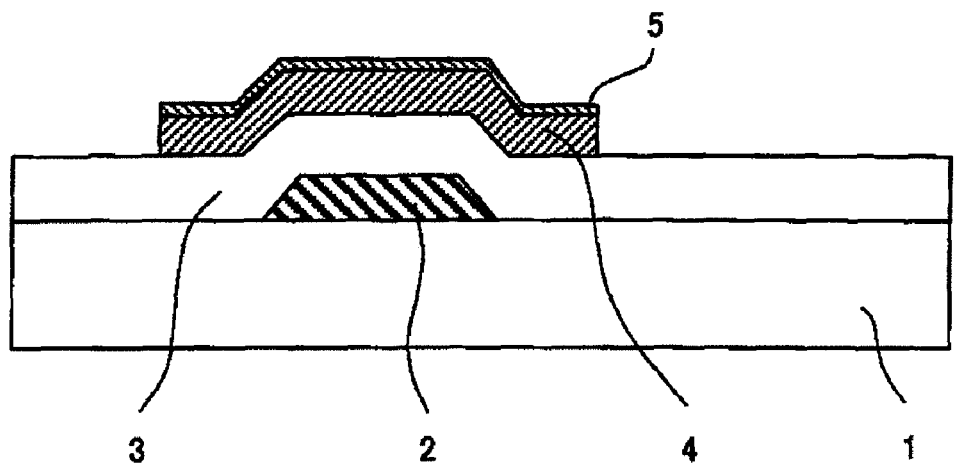
FIG. 2D is a partially enlarged cross-sectional view showing the process continued from FIG. 2C in the manufacturing method of the TFT shown in FIG. 1.
Figure 2E:
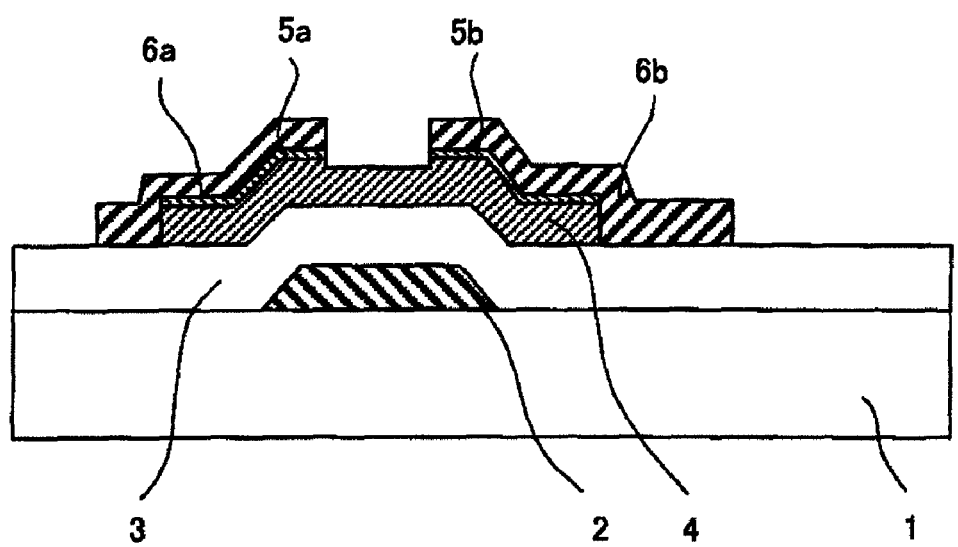
FIG. 2E is a partially enlarged cross-sectional view showing the process continued from FIG. 2D in the manufacturing method of the TFT shown in FIG. 1.

On the other hand, since F contained in $GeF_4$ is bonded to Si to be $SiF_4$ and desorbs from the surface at this temperature, the etching occurs in the semiconductor film 4a in the regions other than the formation regions of the initial nuclei and their peripheries simultaneously with the formation of the nuclei (FIG. 2C(a)). Then, when the etching of the semiconductor film 4a proceeds with the crystal growth of SiGe using the initial nuclei as seeds, the surface of the gate insulating film 3 is exposed in the regions other than the growth regions of the SiGe crystals. As a result, the semiconductor crystal nuclei 4b in which the surfaces of the semiconductor films 4a left in the island-like shape are surrounded by SiGe crystals are formed (FIG. 2C (b)). Although the case where the adjacent semiconductor crystal nuclei 4b are separated from each other has been shown here, it does not matter if they are in contact with each other. The size of the crystal nuclei is desirably 10 nm or larger in order to achieve the good crystallinity in the semiconductor film 4c to be formed later, and is preferably 100 nm or smaller in order to suppress the increase in the surface roughness.

Alternatively, the semiconductor crystal nuclei made of only Ge may be formed. Thereafter, when the film is subsequently formed, since SiGe is hardly deposited on the insulating film and is crystal-grown on the semiconductor crystal, the polycrystalline semiconductor film 4c selectively grown with using the semiconductor crystal nuclei 4b as seeds is formed (FIG. 2C(c)). The polycrystalline film mentioned here indicates a film mostly made of crystalline tissue, and the crystal grain size in the film is about 30 nm or larger. The deposition conditions of the semiconductor film 4c may be completely the same as those of the semiconductor crystal nuclei 4b. However, since the selective growth is possible in the case of the SiGe film even when the composition ratio of Ge is low, for example, only the flow rate of $Si_2H_6$ may be increased and changed to 1.5 sccm. Furthermore, since the etching is performed in the subsequent formation of the source and the drain of the TFT, the thickness of the semiconductor film 4c is preferably adjusted to 100 to 300 nm in combination with the film thickness of the semiconductor crystal nuclei 4b in order to prevent the semiconductor film 4c from being too thin to maintain the TFT characteristics by the etching.

Figure 3:
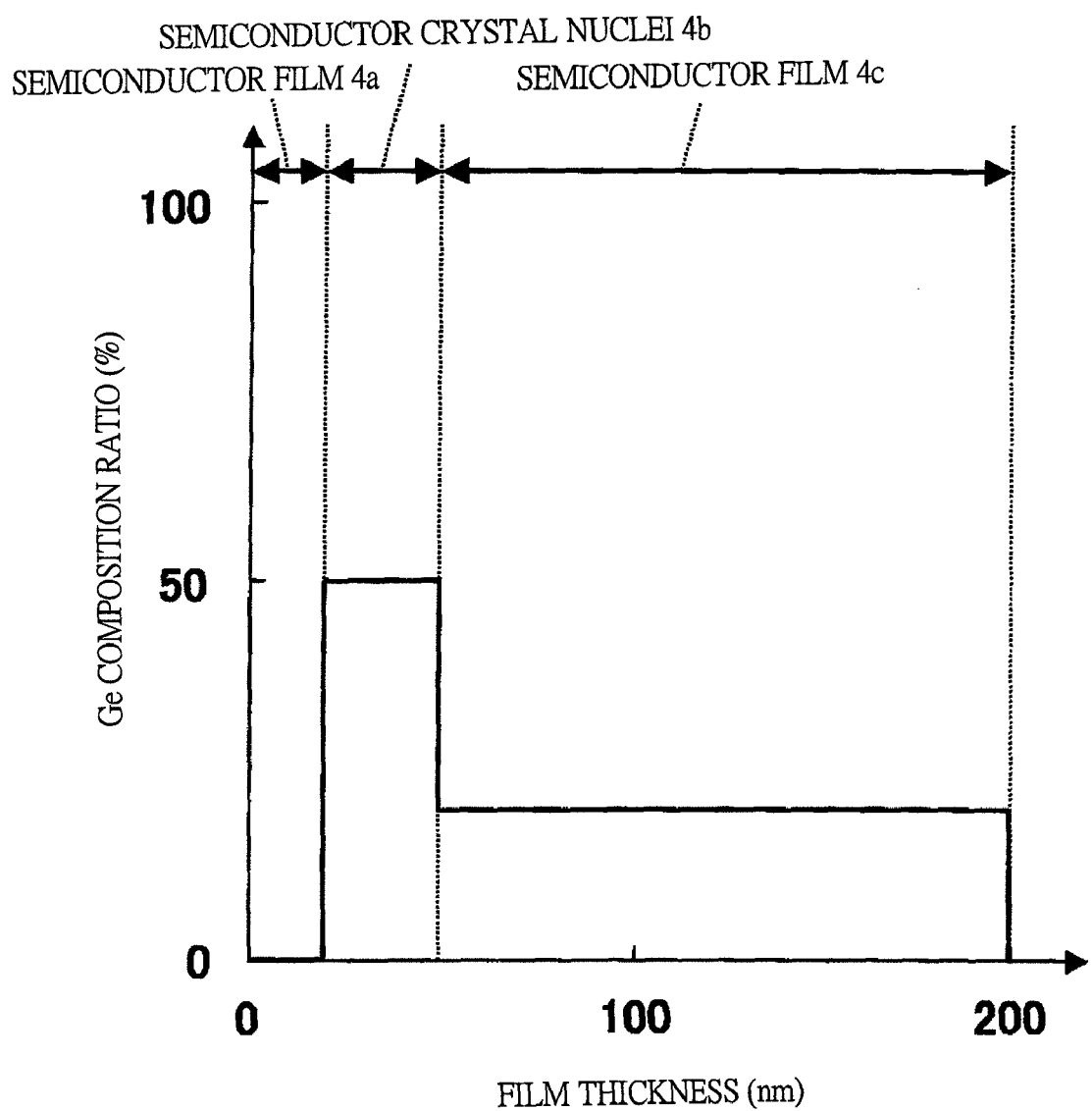
FIG. 3 is a graph showing the Ge composition ratio profile in the semiconductor layer of the TFT shown in FIG. 1.

The Ge composition ratio profile in the semiconductor film 4 is, for example, like that shown in FIG. 3. This profile is taken along the dotted line a-a' shown in FIG. 2C(c). Here, the semiconductor crystal nuclei 4b are formed under the deposition conditions 1 described above, and the deposition conditions of the semiconductor film 4c are the same as those of the deposition conditions 1 other than that the $Si_2H_6$ flow rate is changed to 1.5 sccm. Although Ge is not contained in the semiconductor film 4a made of amorphous silicon or microcrystalline silicon, the Ge composition ratio of about 50% is contained in the semiconductor crystal nuclei 4b made of SiGe. Furthermore, the Ge composition ratio is about 20% in the semiconductor film 4c made of SiGe.

As described above, in the manufacturing method of the semiconductor device according to the present embodiment, the Ge composition ratio tends to be high in the semiconductor crystal nuclei 4b. This is because, since the nucleus deposition temperature is set to 450° C. or lower, the thermal decomposition of $Si_2H_6$ does not proceed compared with $GeF_4$ and Si is hard to be incorporated in the semiconductor crystal nuclei 4b. Note that this Ge composition ratio profile is the same also in the semiconductor films in the following embodiments if the film deposition by the reactive thermal CVD method is performed. Further, the Ge composition ratios in the semiconductor crystal nuclei 4b and the semiconductor film 4c are not limited to the above-described values, and they can be controlled to various values by the adjustment of the ratio of gas flow of the source gases, for example, $Si_2H_6$ and $GeF_4$ and the deposition temperature. Through the process described above, the structure shown in FIG. 2C is obtained.

Subsequently, an $n^+$ Si film 5 to be a contact layer is formed on the semiconductor film 4 by the plasma enhanced CVD method. In the film deposition, the conditions of the semiconductor film 4a made of, for example, hydrogenated amorphous silicon may be used and phosphine ($PH_3$) or the hydrogen-diluted gas thereof ($PH_3/H_2$) may be additionally supplied as an n-type doping gas. It is desirable that the doping concentration is set to $1 \times 10^{17}$ cm$^{-3}$ or higher in order to form a low-resistance contact layer and to $1 \times 10^{22}$ cm$^{-3}$ or lower in order to suppress the deterioration of crystallinity and the resistance increase due to the clustering and segregation of the dopant atoms. Furthermore, the film thickness is preferably about 40 nm as a contact. Thereafter, the stacked film made up of the $n^+$ Si film 5 and the semiconductor film 4 is processed into an island-like shape by using the photolithography. Through the process described above, the structure shown in FIG. 2D is obtained.

Next, a metal film is deposited on the substrate on which the stacked film has been processed. As the material of the film, Nb, Mo, W, Ta, Cr, Ti, Fe, Ni or Co, alloy of these metals and a stacked film of these metals can be used. Alternatively, since the upper limit temperature of the process can be decreased, a low-resistance metal such as Al or Cu can also be used. These films can be formed by the sputtering method. In the present embodiment, a stacked film of AlNd alloy/Cr is used. The film thickness is set to 200/50 nm. Then, the film is processed to the source electrode wiring pattern 6a and the drain electrode wiring pattern 6b by using the photolithography.

Furthermore, the $n^+$ Si film 5 and a part of the semiconductor film 4 on a front surface side on the region to be the channel of the TFT are etched with using the source electrode wiring 6a and the drain electrode wiring 6b as masks, thereby forming the contact layers 5a and 5b. Through the process described above, the structure shown in FIG. 2E is obtained.

Next, the passivation insulating film 7 made of an SiN film is formed by the plasma enhanced CVD method on the source electrode wiring 6a and the drain electrode wiring 6b. For example, the film thickness is preferably 500 nm.

Subsequently, the interlayer insulating layer 8 made of, for example, organic resin is formed on the passivation insulating film 7, and then, a contact hole is provided in the interlayer insulating layer 8 and the passivation insulating film 7 at the position corresponding to the formation region of the drain electrode wiring 6b by using the photolithography.

Finally, for example, an Al film is deposited by the sputtering method and then processed by using the photolithography, thereby forming the pixel electrode 9. A reflective metal film or a transparent conductive film can be used as the pixel electrode 9, and the film thickness is preferably 100 nm. Through the process described above, the bottom-gate TFT shown in FIG. 1 is completed.

In the TFT of the present embodiment, although the semiconductor films 4a made of amorphous silicon or microcrystalline silicon are left on the gate insulating film 3, since the semiconductor crystal nuclei 4b and the polycrystalline semiconductor film 4c are formed between the adjacent semiconductor films 4a and a combined area of the semiconductor crystal nuclei 4b and the semiconductor film 4c can be made larger than an area of the semiconductor films 4a in terms of the occupied area on the gate insulating film, the performance significantly higher than that of the conventional amorphous silicon TFT and that of the TFT having a polycrystalline silicon film formed by the conventional plasma enhanced CVD method can be achieved in the TFT of the present embodiment.

When the manufacturing method of the semiconductor device shown in the present embodiment is used, since the semiconductor films 4a are formed on the gate insulating film 3 in advance, the deposition of the semiconductor crystal nuclei 4b by the reactive thermal CVD method can be achieved even at the low temperature of 450° C. or lower. The hydrogen termination is easily maintained in the defects in the semiconductor layer of the TFT at the low temperature like this. Therefore, since the off leakage current is hard to be generated, the good TFT characteristics can be achieved.

Also, when the manufacturing method of the semiconductor device according to the present embodiment in which the semiconductor crystal nuclei can be formed at 450° C. or lower is used, the glass substrate is not softened and the possibility of the occurrence of the hillock and void in the metal film is low. Therefore, since the increase in the resistance of metal line due to the damage on the metal film for gate electrode is suppressed, the manufacturing method according to the present embodiment has the advantage that the TFT with good characteristics can be manufactured.

Furthermore, when the deposition by the reactive thermal CVD method is performed at the low temperature of 450° C. or lower, the size of the semiconductor crystal nuclei 4b tends to be uniform compared with the deposition at a higher temperature. Therefore, on the semiconductor crystal nuclei 4b formed at a low temperature, the crystal grain size in the polycrystalline semiconductor film 4c is uniformized. Therefore, the manufacturing method of the semiconductor device according to the present embodiment is suitable for forming the pixel TFTs with small variation in threshold voltage on a large-area glass substrate, and is thus preferable for the development of the large-size OLED display.

Also, in the reaction between the silane-based source gas and $GeF_4$, the Ge nuclei tend to be formed at a low temperature. Therefore, since the semiconductor crystal nuclei 4b in the manufacturing method of the semiconductor device according to the present embodiment contain at least Ge, the nuclei can be formed at a low temperature of 450° C. or lower.

Furthermore, if Ge is contained also in the semiconductor film 4c, the semiconductor film 4c can be selectively crystal-grown on the semiconductor crystal nuclei 4b and their peripheries almost without forming the semiconductor film 4c in the regions where the semiconductor film 4a has been removed by etching. Accordingly, there is the advantage that the crystallinity sufficient for securing the TFT characteristics can be obtained in the semiconductor film 4c.

Second Embodiment

Figure 4:
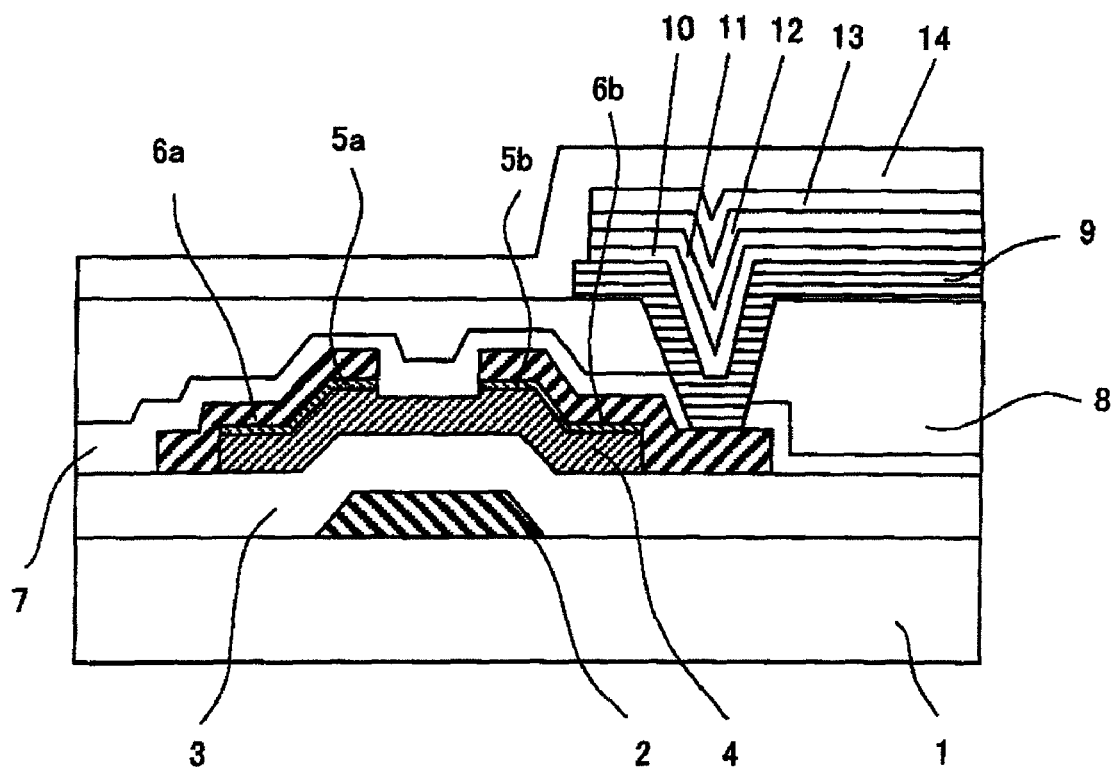
FIG. 4 is a view showing the cross-sectional structure of the OLED display apparatus formed by using the TFT shown in FIG. 1.

As the second embodiment of the present invention, an example of the application to the OLED will be described with reference to FIG. 4. First, the bottom-gate TFT is formed in the same method as the first embodiment. Next, as shown in FIG. 4, a charge transport layer 10, a light emission layer 11 and a charge transport layer 12 are formed by the deposition method and others on the pixel electrode 9. Further, by forming an upper electrode 13 made of a transparent conductive film by the deposition or sputtering method and then forming a sealing layer 14, the OLED display apparatus shown in FIG. 4 is completed.

As described in the first embodiment, the variation in threshold voltage is small in the TFTs formed on a large-size substrate by the manufacturing method of the invention of the present application. Therefore, since the current flowing in the light emission layer of the OLED is strictly controlled and the variation in luminance of each pixel is suppressed, the application to the large-size panel and the high-quality image can be achieved in the OLED according to the present embodiment.

Third Embodiment

Figure 5:
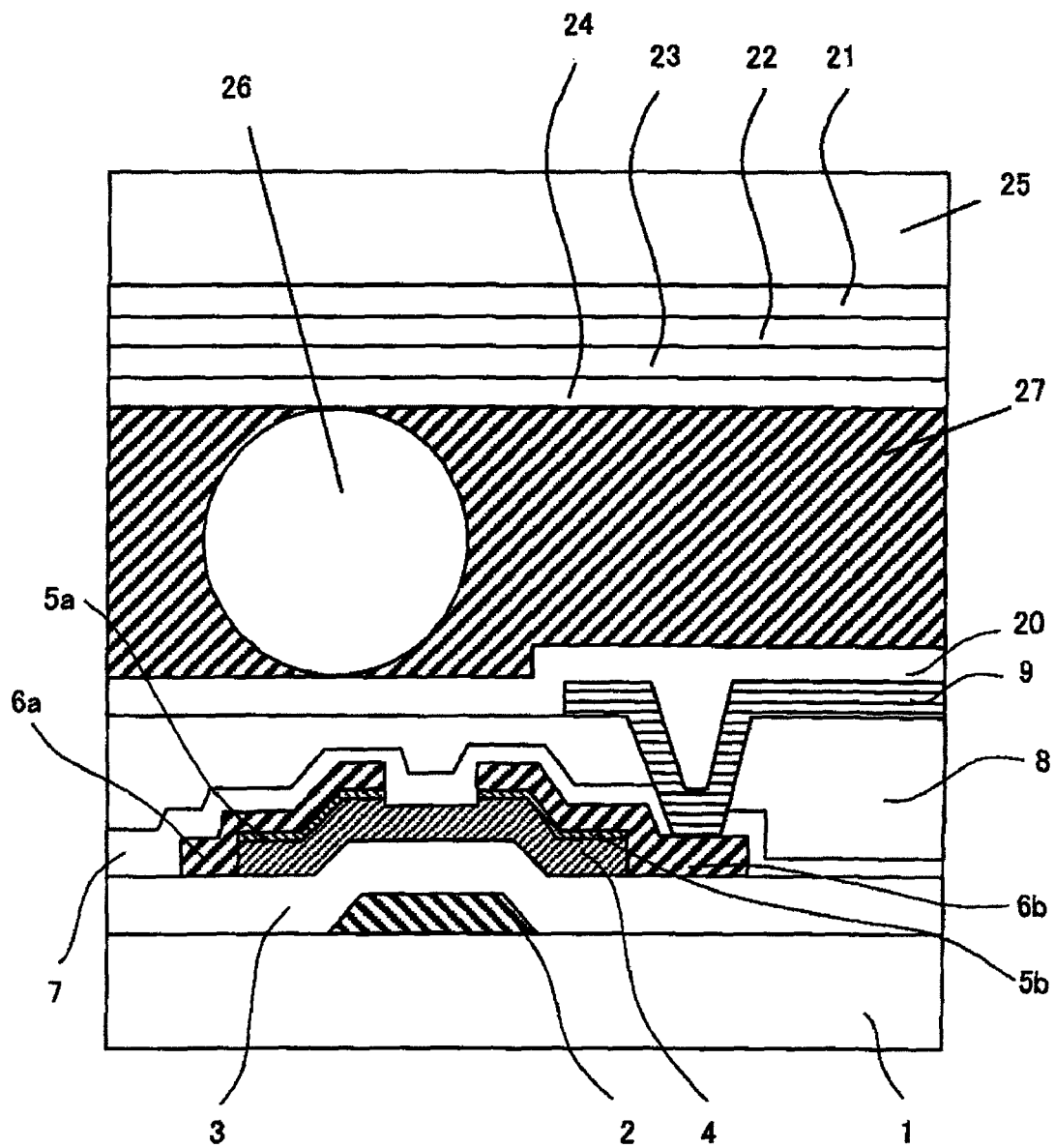
FIG. 5 is a view showing the cross-sectional structure of the liquid crystal display apparatus formed by using the TFT shown in FIG. 1.

As the third embodiment of the present invention, an example of the application to the liquid crystal display apparatus will be described with reference to FIG. 5. First, the bottom-gate TFT is formed in the same method as the first embodiment. Note that a transparent conductive film is used as the pixel electrode 9. More specifically, the pixel electrode 9 is made of an ITO film formed by the sputtering method and processed by using the photolithography. The film thickness is preferably 70 nm. Next, as shown in FIG. 5, an alignment film 20 is formed on the pixel electrode 9. Next, an opposite substrate 25 on which a color filter layer 21, an overcoat layer 22, an opposite electrode 23 made of an ITO film and an alignment film 24 are sequentially formed is attached via a spacer 26. By injecting the liquid crystal 27 thereinto, the liquid crystal display apparatus shown in FIG. 5 is completed.

As described in the first embodiment, since the off leakage current is hard to be generated in the TFT formed by the manufacturing method of the invention of the present application, the reduction in the off-current and the high-quality image can be achieved also in the application to the pixel driving of the liquid crystal display.

Fourth Embodiment

Figure 6:
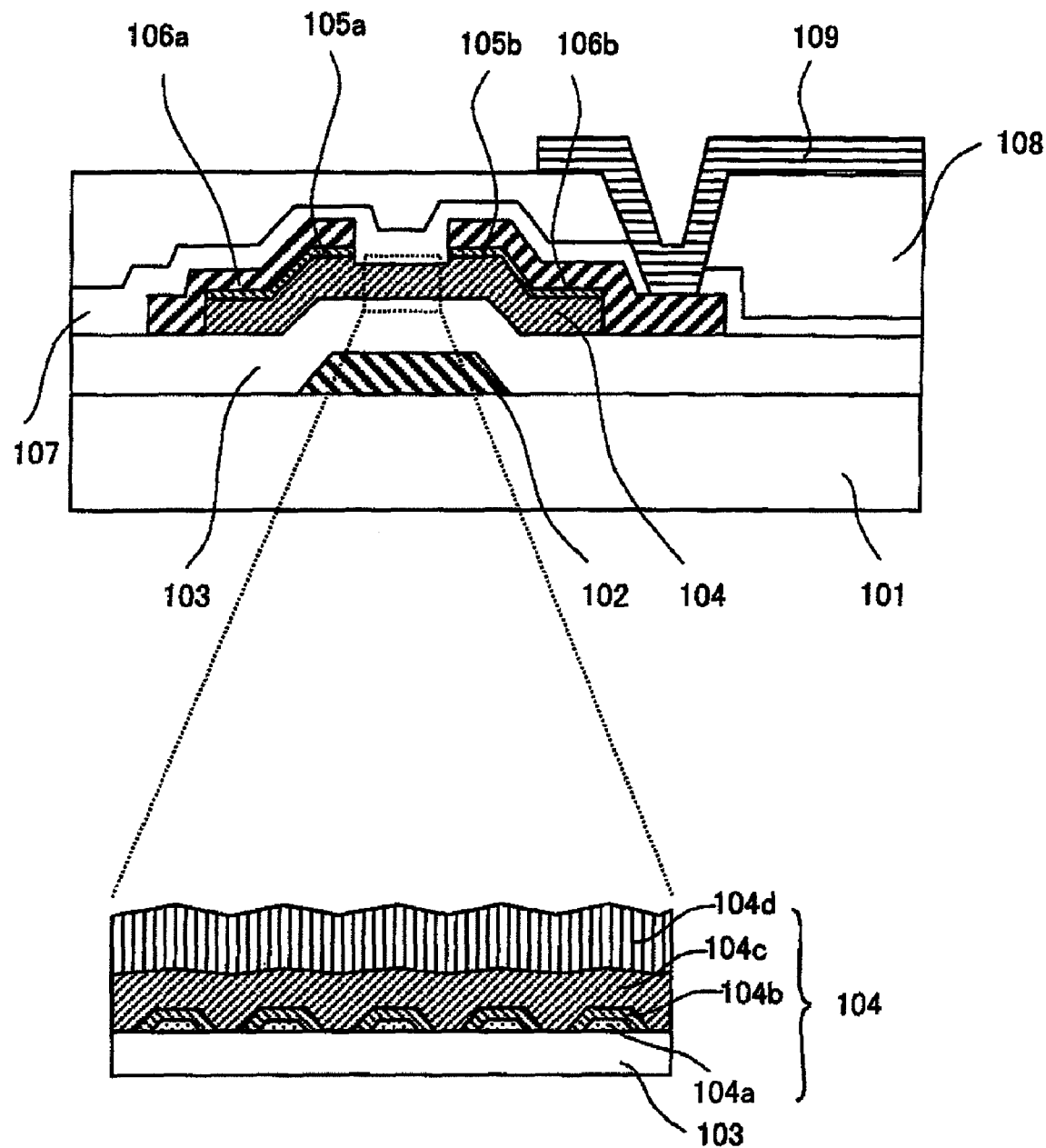
FIG. 6 is a cross-sectional structural view of the bottom-gate TFT for describing the fourth embodiment of the semiconductor device formed by using the manufacturing method of the semiconductor device according to the present invention.

The fourth embodiment of the semiconductor device fabricated by using the manufacturing method of the semiconductor device according to the present invention will be described with reference to FIG. 6. In the fourth embodiment, the difference from the first embodiment lies in the layer structure of the semiconductor film formed in the bottom-gate TFT.

Similar to the TFT of the first embodiment, a gate electrode wiring 102 is formed on a part of an insulating substrate 101, and further a gate insulating film 103 is formed. A semiconductor film 104 is formed in a TFT formation region of the gate insulating film 103. This semiconductor film 104 is made up of semiconductor films 104a, semiconductor crystal nuclei 104b formed around the semiconductor films 104a, a semiconductor film 104c formed on the semiconductor crystal nuclei 104b and further a semiconductor film 104d. Furthermore, an n$^+$ silicon film 105a and a source electrode wiring 106a of a source region and an n$^+$ silicon film 105b and a drain electrode wiring 106b of a drain region are formed. A passivation insulating film 107 and an interlayer insulating film 108 are further deposited on the source electrode wiring 106a and the drain electrode wiring 106b. Also, a pixel electrode 109 connected to the drain electrode wiring 106b is formed.

The manufacturing process of the TFT having the structure shown in FIG. 6 will be described below. First, the gate electrode wiring 102 and the gate insulating film 103 are formed on the insulating substrate 101, but the description thereof is omitted because they can be formed in the same manner as the first embodiment.

Also, the following sequential deposition of the semiconductor films 104a, the semiconductor crystal nuclei 104b and the semiconductor film 104c on the gate insulating film 103 can be made with the same material and film quality by the same deposition method under the same conditions as those of the semiconductor films 4a, the semiconductor crystal nuclei 4b and the semiconductor film 4c in the first embodiment.

Subsequently, the semiconductor film 104d is grown on the semiconductor film 104c. The film material thereof is preferably, for example, amorphous silicon containing hydrogen, microcrystalline silicon or polycrystalline silicon. It is also preferable that the film is formed by the plasma enhanced CVD method. With respect to the deposition conditions, the same deposition conditions as those used to form the semiconductor films 4a of the first embodiment can be used when the film made of, for example, amorphous silicon is formed. Further, it is desirable that the film thickness of the semiconductor film 104d is adjusted so that the semiconductor film 104 has the thickness of about 200 nm.

Hereinafter, in the process from the deposition of the n$^+$ silicon film 105a in the source region and the n$^+$ silicon film 105b in the drain region to the formation of the pixel electrode 109, the same materials and conditions as those of the process described in the first embodiment can be used in the same manner. Therefore, the description thereof is omitted here. Through the process described above, the structure shown in FIG. 6 is obtained.

According to the present embodiment, the semiconductor film 104d made of, for example, amorphous silicon containing hydrogen is formed. Therefore, even when the semiconductor crystal nuclei 104b and semiconductor film 104c having a low hydrogen content are used, the hydrogen concentration required for the hydrogen termination of the crystal defect in the semiconductor crystal nuclei 104b and the semiconductor film 104c can be secured by the hydrogen supply from the high-hydrogen-containing semiconductor film 104d. Accordingly, the interface trap density of the channel portion is reduced compared with the TFT of the first embodiment, and the TFT having good characteristics such as high mobility and small threshold voltage shift can be fabricated.

Fifth Embodiment

Figure 7:
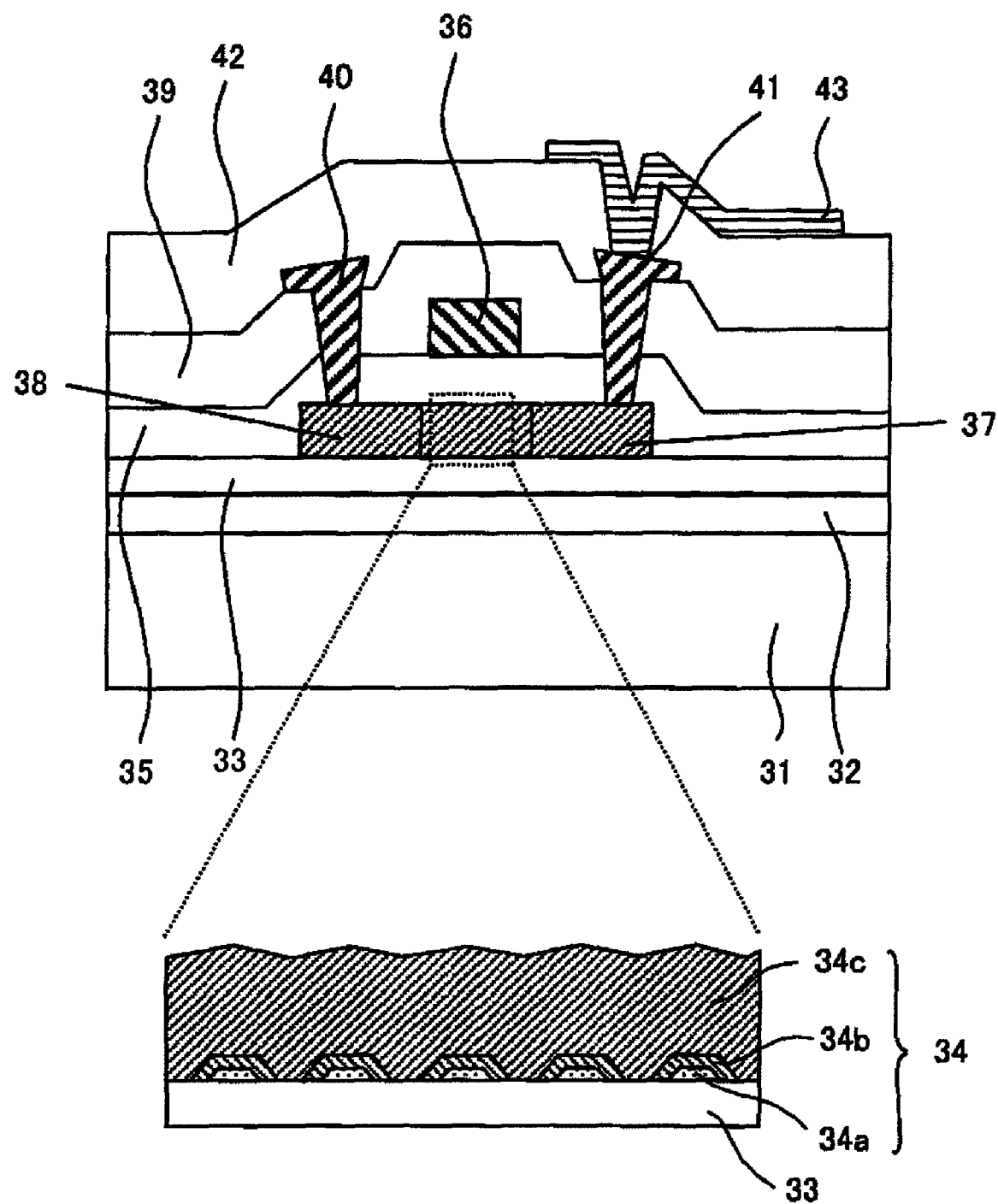
FIG. 7 is a cross-sectional structural view of the top-gate TFT for describing the fifth embodiment of the semiconductor device formed by using the manufacturing method of the semiconductor device according to the present invention.

The fifth embodiment of the semiconductor device fabricated by using the manufacturing method of the semiconductor device according to the present invention will be described with reference to FIG. 7. In the fifth embodiment, the difference from the first embodiment lies in that the semiconductor device is a top-gate TFT. An SiN film 32 and an SiO film 33 to be base insulating films are formed on an insulating substrate 31, and a semiconductor film 34 is formed in a TFT formation region of the SiO film 33. This semiconductor film 34 is made up of semiconductor films 34a made of, for example, amorphous silicon formed on the SiO film 33, semiconductor crystal nuclei 34b made of, for example, SiGe formed on the semiconductor films 34a and a semiconductor film 34c made of, for example, polycrystalline SiGe formed on the semiconductor crystal nuclei 34b.

Furthermore, a gate insulating film 35 and a gate electrode wiring 36 are formed on the semiconductor film 34. Also, in the semiconductor film 34 other than the part below the gate electrode wiring 36, contact regions 37 and 38 are formed. On the substrate on which the components described above have been formed, an interlayer insulating layer 39 is deposited, and contact holes are further opened on the contact regions 37 and 38. A source electrode wiring 40 and a drain electrode wiring 41 are filled in these openings. Furthermore, a passivation insulating film 42 is deposited on these wirings and the interlayer insulating film 39, and a contact hole is opened on the drain electrode wiring 41 to form a pixel electrode 43.

The manufacturing process of the TFT having the structure shown in FIG. 7 will be described below. First, the SiN film 32 and SiO film 33 to be base insulating films are formed on the insulating substrate 31 made of, for example, glass. The plasma enhanced CVD method or the sputtering method can be used as the deposition method thereof. Subsequently, the semiconductor films 34a to be a part of the semiconductor film 34 of the TFT are deposited on the SiO film 33. The semiconductor films 34a are preferably made of, for example, an amorphous silicon film or a microcrystalline silicon film, and the same deposition method and conditions as those used in the deposition of the semiconductor films 4a described in the first embodiment can be used.

Thereafter, the semiconductor crystal nuclei 34b and the semiconductor film 34c are further formed on the semiconductor films 34a as a part of the semiconductor film 34 of the TFT. The deposition method, the deposition conditions, the deposition process of the crystal nuclei and the film, the Ge composition ratio profile and others may be the same as those described in the deposition of the semiconductor crystal nuclei 4b and the semiconductor film 4c of the first embodiment. Subsequently, the deposited semiconductor film 34 is processed into an island-like shape by using the photolithography.

Next, the gate insulating film 35 is formed on the SiO film 33 and the semiconductor film 34. SiO, SiN and others are preferable as the material of the film. The film made of these materials may be formed by the plasma enhanced CVD method or the sputtering method. Alternatively, the plasma oxidation, the photooxidation and the like may be used in combination. Therefore, an SiO film with a thickness of 100 nm formed by, for example, the plasma enhanced CVD method using TEOS is applied as the gate insulating film 35.

Subsequently, a wiring film is deposited on the gate insulating film 35. As the material of the film, Si, Ge or alloy thereof, a metal such as Nb, Mo, W, Ta, Cr, Ti, Fe, Ni or Co, alloy of these metals or a stacked film of these metals is preferably selected. Furthermore, a low-resistance metal such as Al or Cu can also be used. These films may be formed by the sputtering method. Therefore, an Nb film with a thickness of, for example, 200 nm is applied as the wiring film. Thereafter, the wiring film is processed by the photolithography to form a gate electrode wiring pattern 36.

Furthermore, P or B is implanted into parts of the semiconductor layer 34 through the gate insulating film 35 by the ion implantation method using the gate electrode wiring pattern 36 as a mask, thereby forming the contact regions 37 and 38.

Then, an SiO film or an SiN film is formed by the plasma enhanced CVD method or the sputtering method as the interlayer insulating layer 39 on the substrate on which the components described above have been formed. Therefore, an SiO film with a thickness of 300 nm formed by, for example, the plasma enhanced CVD method using TEOS is applied as the interlayer insulating layer 39.

Next, contact holes are opened in the interlayer insulating layer 39 on the contact regions 37 and 38, and a wiring film is deposited inside the openings and on the interlayer insulating layer 39. As the material of the film, a metal such as Nb, Mo, W, Ta, Cr, Ti, Fe, Ni or Co, alloy of these metals or a stacked film of these metals is preferably selected. Furthermore, a low-resistance metal such as Al or Cu can also be used. These films may be formed by the sputtering method. Therefore, a Cr film with a thickness of, for example, 200 nm is applied as the wiring film. Thereafter, the wiring film is processed by the photolithography to form the source electrode wiring 40 and the drain electrode wiring 41.

Next, the passivation insulating film 42 is formed on the interlayer insulating layer 39, the source electrode wiring 40 and the drain electrode wiring 41. An SiN film with a thickness of 500 nm formed by, for example, the plasma enhanced CVD method is applied as the passivation insulating film 42.

Subsequently, a contact hole is opened in the passivation insulating film 42 on the drain electrode wiring 41, and a wiring film is deposited inside the opening and on the passivation insulating film 42. As the material of the film, a reflective metal film or a transparent conductive film such as ITO (indium-tin-oxide), IZO (indium-zinc-oxide) or ZnO (zinc oxide) is preferably selected. Therefore, a Cr film with a thickness of 100 nm formed by the sputtering method is applied. Thereafter, this wiring film is processed by the photolithography to form the pixel electrode 43. Through the process described above, the TFT having the structure shown in FIG. 7 is completed.

In the top-gate TFT described in the present embodiment, since the channel portion is formed in the polycrystalline semiconductor film 34c formed on the front surface side of the semiconductor film 34, the TFT which has high mobility and small variation in threshold voltage can be easily achieved. Therefore, the manufacturing method of the semiconductor device according to the invention of the present application is suitable not only for the fabrication of the bottom-gate TFT described in the first embodiment but also for the fabrication of the top-gate TFT described in the present embodiment.

Sixth Embodiment

Figure 8:
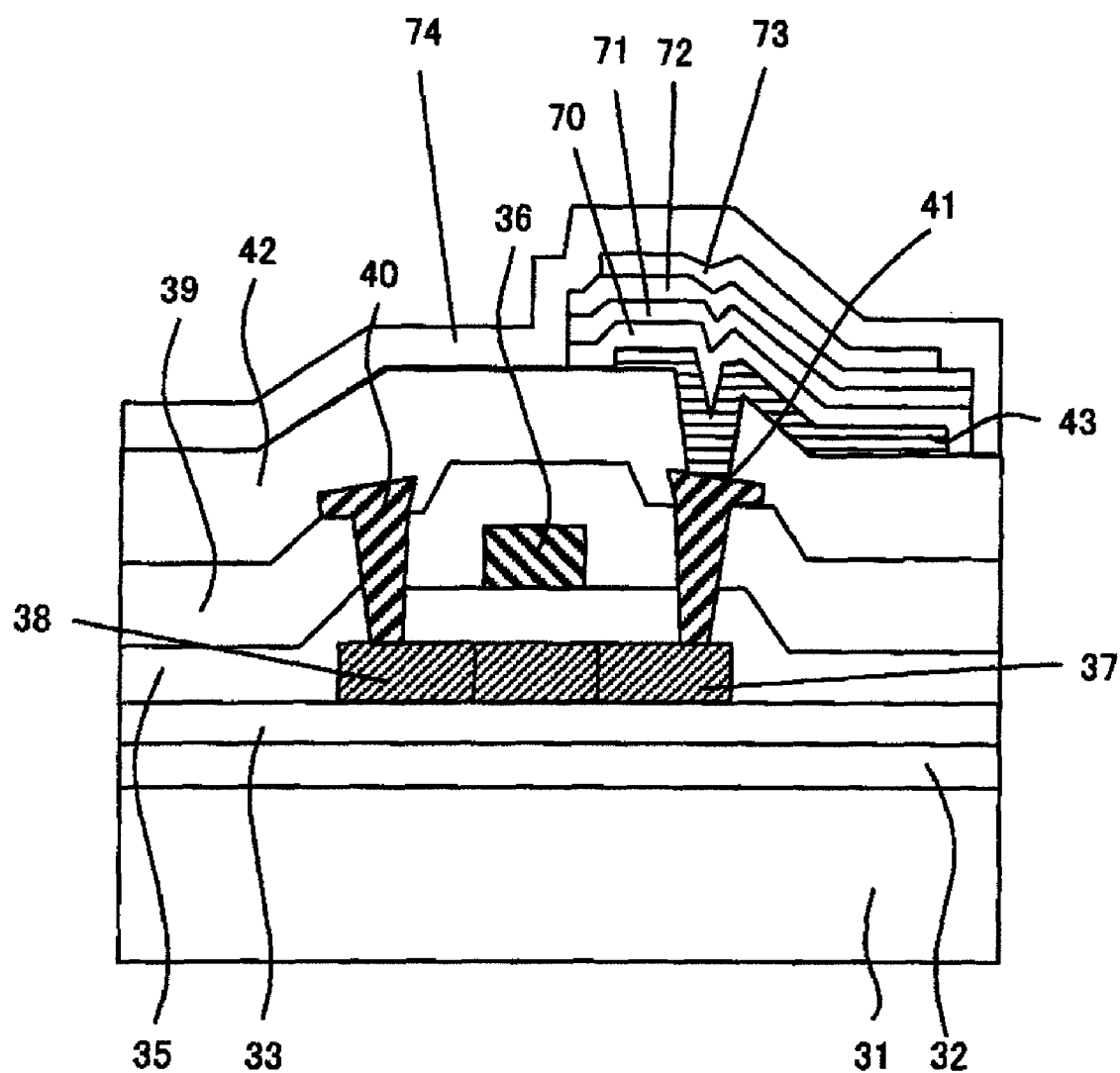
FIG. 8 is a view showing the cross-sectional structure of the OLED formed by using the TFT shown in FIG. 7.

As the sixth embodiment of the present invention, an example of the application to the OLED will be described with reference to FIG. 8. First, the top-gate TFT is formed in the same method as the fifth embodiment. Next, as shown in FIG. 8, a charge transport layer 70, a light emission layer 71 and a charge transport layer 72 are formed by the deposition method and others on the pixel electrode 43. Further, by forming an upper electrode 73 made of a transparent conductive film by the deposition or sputtering method and then forming a sealing layer 74, the OLED display apparatus shown in FIG. 8 is completed.

In the TFTs formed on a large-size substrate by the manufacturing method according to the fifth embodiment, the variation in threshold voltage is small. Therefore, since the current flowing in the light emission layer of the OLED is strictly controlled and the variation in luminance of each pixel is suppressed, the application to the large-size panel and the high-quality image can be achieved in the OLED display apparatus according to the present embodiment.

Seventh Embodiment

Figure 9:
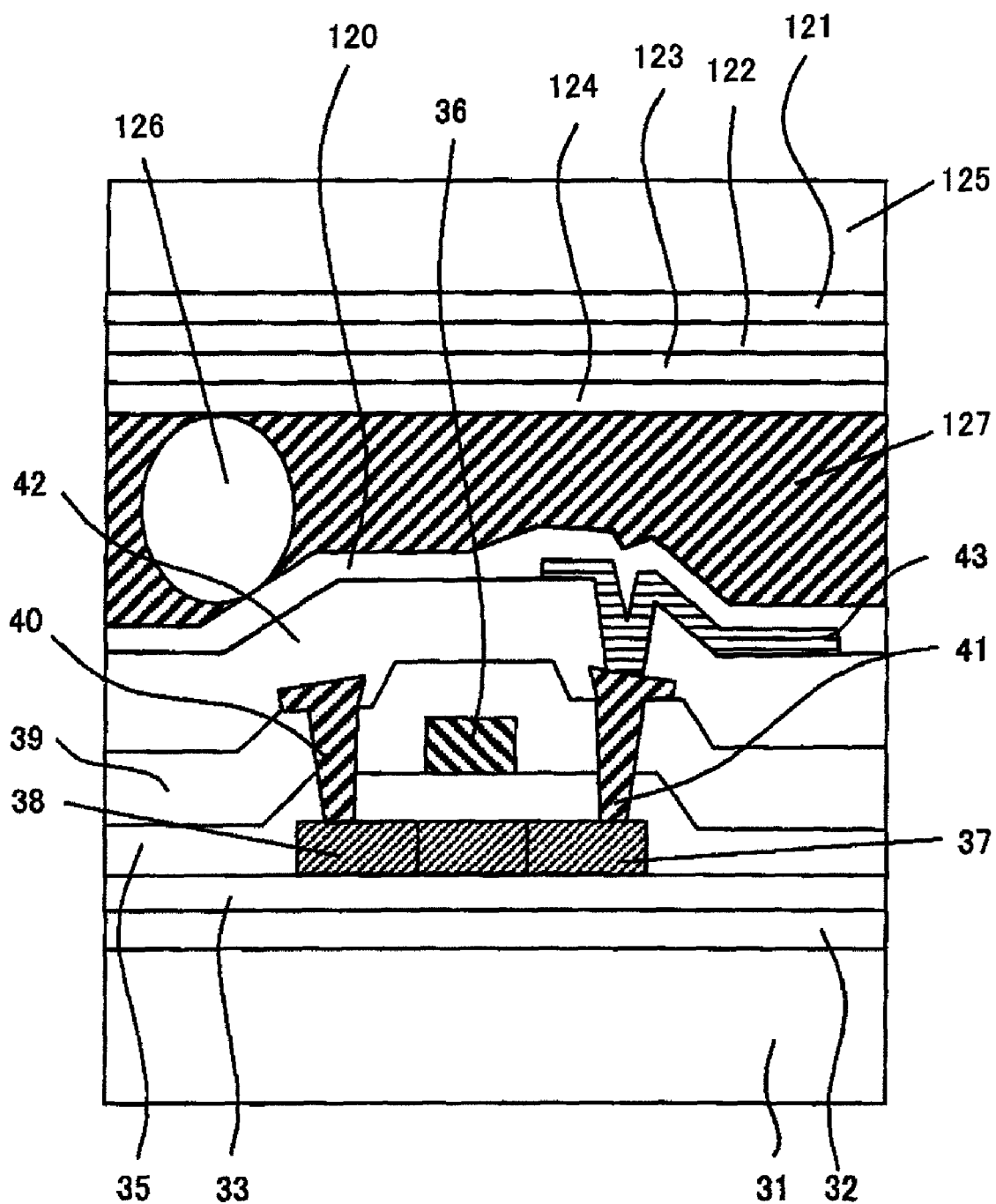
FIG. 9 is a cross-sectional structural view of the liquid crystal display apparatus formed by using the TFT shown in FIG. 7.

As the seventh embodiment of the present invention, an example of the application to the liquid crystal display apparatus will be described with reference to FIG. 9. First, the top-gate TFT is formed in the same method as the fifth embodiment. Note that a transparent conductive film is used as the pixel electrode 43. More specifically, the pixel electrode 43 is made of an ITO film formed by the sputtering method and processed by using the photolithography. The film thickness is preferably 70 nm. Next, as shown in FIG. 9, an alignment film 120 is formed on the pixel electrode 43. Next, an opposite substrate 125 on which a color filter layer 121, an overcoat layer 122, an opposite electrode 123 made of an ITO film and an alignment film 124 are sequentially formed is attached via a spacer 126. By injecting the liquid crystal 127 thereinto, the liquid crystal display apparatus shown in FIG. 9 is completed.

Since the off leakage current is hard to be generated in the TFT formed by the manufacturing method according to the fifth embodiment, the reduction in the off-current and the high-quality image can be achieved also in the application to the pixel driving of the liquid crystal display.

Eighth Embodiment

Figure 10:
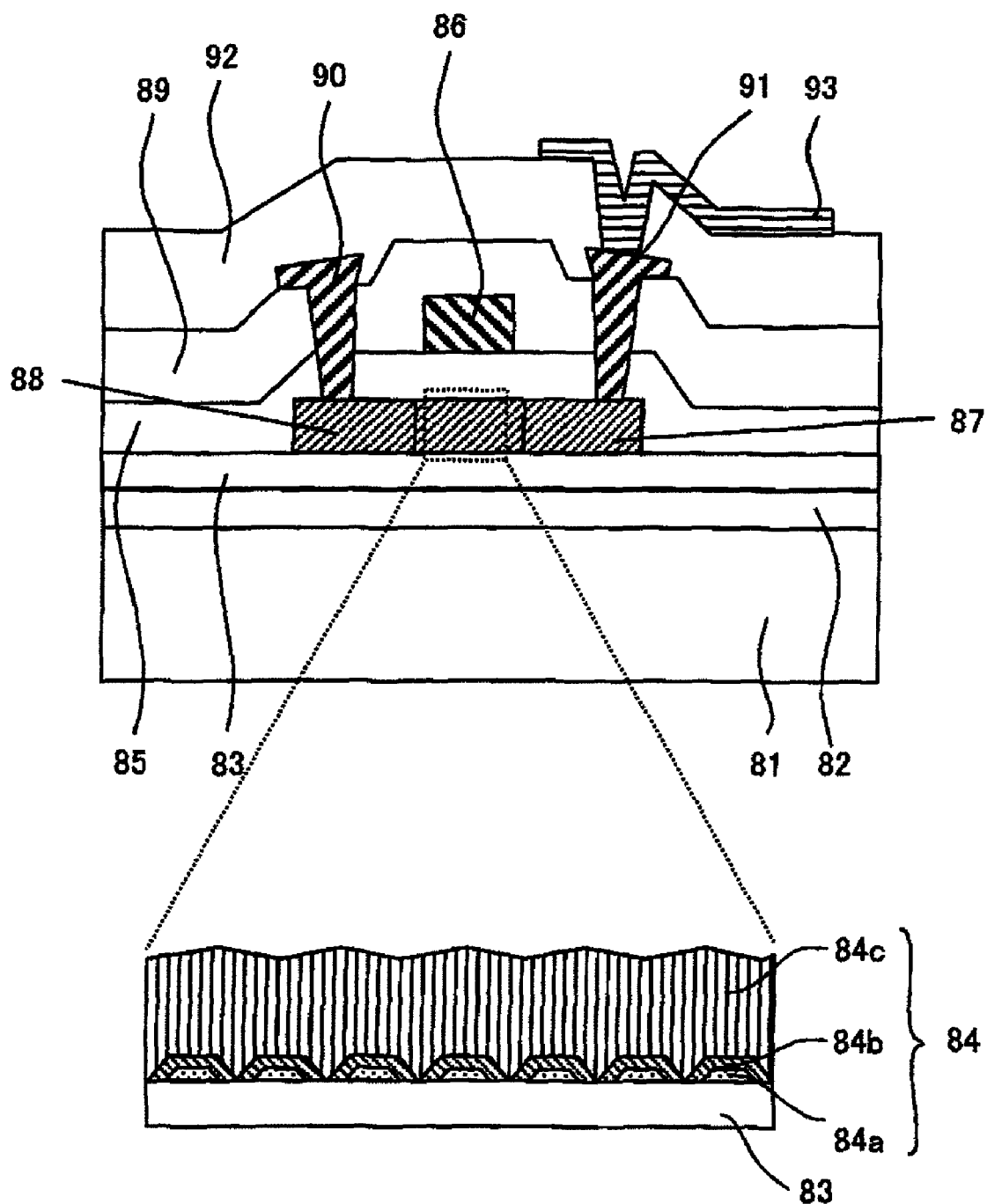
FIG. 10 is a cross-sectional structural view of the top-gate TFT for describing the eighth embodiment of the semiconductor device formed by using the manufacturing method of the semiconductor device according to the present invention.

Another embodiment of the semiconductor device fabricated by using the manufacturing method of the semiconductor device according to the present invention will be described with reference to FIG. 10. The difference from the fifth embodiment lies in the method of forming the semiconductor crystal nuclei and the material of the semiconductor film formed in the top-gate TFT.

Similar to the TFT of the fifth embodiment, an SiN film 82 to be a base insulating film and an SiO film 83 are formed on an insulating substrate 81. Further, a semiconductor film 84 is formed in a TFT formation region of the SiO film 83, but different from the fourth embodiment, the semiconductor film 84 has a stacked structure made up of semiconductor films 84a made of, for example, amorphous silicon, semiconductor crystal nuclei 84b made of, for example, SiGe and a semiconductor film 84c made of, for example, polycrystalline silicon. Also, a gate insulating film 85, a gate electrode wiring 86 formed on the semiconductor film 84, contact regions 87 and 88 provided in the semiconductor layer 84, an interlayer insulating layer 89, a source electrode wiring 90, a drain electrode wiring 91, a passivation insulating film 92, a pixel electrode 93 and others are formed in the same manner as the TFT of the fifth embodiment.

The manufacturing process of the TFT having the structure shown in FIG. 10 will be described below. First, the SiN film 82 and the SiO film 83 are formed on the insulating substrate 81, but the description thereof is omitted because they can be formed in the same manner as the deposition of the SiN film 32 and the SiO film 33 in the fifth embodiment.

Also, the subsequent deposition of the semiconductor films 84a on the SiO film 83 can be made with the same material and film quality by the same deposition method under the same conditions as those of the semiconductor films 34a in the fifth embodiment.

Next, the semiconductor crystal nuclei 84b can be formed with the same material and film quality and by the same deposition method as those of the semiconductor crystal nuclei 34b in the fifth embodiment, but the adjacent semiconductor crystal nuclei 84b are formed so as to be in contact with each other as much as possible in the present embodiment. This is in order to enable the deposition of a polycrystalline silicon film as the semiconductor film 84c. More specifically, as described above, an SiGe film is selectively grown more easily on a semiconductor polycrystalline film such as a silicon film than on an insulating film such as a silicon oxide film or a silicon nitride film, but a silicon film can be easily formed almost regardless of the underlying base material, and therefore, when the surface of the SiO film 83 is exposed between the semiconductor crystal nuclei 84b, the polycrystalline silicon film is grown on the semiconductor crystal nuclei 84b and their peripheries, but an amorphous silicon film which hinders the improvement in the TFT characteristics is deposited on the SiO film 83.

Next, the semiconductor film 84c is grown on the semiconductor crystal nuclei 84b. For example, polycrystalline silicon containing hydrogen is preferably used as a film material. Also, the deposition method may be the thermal CVD method, and more preferably the plasma enhanced CVD method. With respect to the deposition conditions in the case of using the plasma enhanced CVD method, the same deposition conditions as those used to form the semiconductor films 4a of the first embodiment can be used. Further, it is desirable that the film thickness of the semiconductor film 84c is adjusted so that the semiconductor film 84 has the thickness of about 200 nm.

Hereinafter, in the process from the processing of the semiconductor film 84 into an island-like shape by the photolithography to the formation of the pixel electrode 93, the same materials and conditions as those of the process described in the fifth embodiment can be used in the same manner. Therefore, the description thereof is omitted here. Through the process described above, the structure shown in FIG. 10 is obtained.

According to the present embodiment, the semiconductor film 84c made of polycrystalline silicon can be used as the channel portion of the top-gate TFT. Since the channel portion is made of polycrystalline SiGe in the fifth embodiment, the off-current in the semiconductor layer can be decreased more easily in the present embodiment, and there is the advantage that the TFT with good off-current characteristics can be achieved.

Also, the deposition rate of the polycrystalline film by the reactive thermal CVD method is 5 nm or less per minute and is very low when the substrate temperature is about 450° C., but the high deposition rate of 100 nm or more per minute at the substrate temperature of 250° C. can be achieved in the plasma enhanced CVD method.

Therefore, the significant improvement in the throughput in the TFT manufacture can be achieved by using the plasma enhanced CVD in combination like in the present embodiment compared with the case where the semiconductor layer formed in the TFT is formed only by the reactive thermal CVD method.

Note that the example of the application to the deposition of the semiconductor layer of the top-gate TFT has been described in the present embodiment, but the application to the deposition of the semiconductor layer of the bottom-gate TFT is also possible.

The invention claimed is:

1. A manufacturing method of a semiconductor device comprising at least:
   a first step of forming a first semiconductor film on an insulating substrate;
   a second step of forming semiconductor crystal nuclei on surface portions of the first semiconductor film while simultaneously etching the first semiconductor film to remove the film from regions between adjacent semiconductor crystal nuclei; and a third step of forming a second semiconductor film by using the semiconductor crystal nuclei as seeds.

2. The manufacturing method of the semiconductor device according to claim 1,
wherein an amorphous silicon film or a microcrystalline silicon film is formed as the first semiconductor film in the first step.

3. The manufacturing method of the semiconductor device according to claim 1,
wherein silicon germanium crystal nuclei are formed as the semiconductor crystal nuclei in the second step by a reactive thermal CVD method in which silanes and halogenated germanium are used as source gases and a deposition temperature is set to 450° C. or lower, and
the etching of the first semiconductor film is performed by supply of the halogenated germanium.

4. The manufacturing method of the semiconductor device according to claim 1,
wherein a polycrystalline silicon germanium film is formed as the second semiconductor film in the third step by a reactive thermal CVD method in which silanes and halogenated germanium are used as source gases and a deposition temperature is set to 450° C. or lower.

5. The manufacturing method of the semiconductor device according to claim 1,
wherein a polycrystalline silicon film is formed as the second semiconductor film in the third step.

6. The manufacturing method of the semiconductor device according to claim 1, further comprising:
a fourth step of forming a third semiconductor film on the second semiconductor film.

7. The manufacturing method of the semiconductor device according to claim 6,
wherein an amorphous, microcrystalline or polycrystalline silicon film is formed as the third semiconductor film by a plasma enhanced CVD method in the fourth step.

8. A semiconductor device comprising a semiconductor film, a source electrode, a drain electrode and a gate electrode on an insulating substrate,
wherein the semiconductor film includes first semiconductor islands formed on a surface of the insulating substrate, semiconductor crystal nuclei formed on surface portions of the first semiconductor islands, and a second semiconductor film formed on the semiconductor crystal nuclei.

9. The semiconductor device according to claim 8,
wherein the first semiconductor islands are made of amorphous silicon or microcrystalline silicon.

10. The semiconductor device according to claim 8,
wherein the semiconductor crystal nuclei are made of silicon germanium crystal nuclei.

11. The semiconductor device according to claim 8,
wherein the second semiconductor film is made of a polycrystalline silicon film or a polycrystalline silicon germanium film.

12. The semiconductor device according to claim 8, further comprising:

a third semiconductor film formed on the second semiconductor film.

13. The semiconductor device according to claim 12,
wherein the third semiconductor film is made of an amorphous silicon film, a microcrystalline silicon film, or a polycrystalline silicon film.

14. A display apparatus comprising: a plurality of pixel electrodes formed on a first insulating substrate; an organic EL layer made of a plurality of organic layers stacked on each of the plurality of pixel electrodes; an opposite electrode covering the organic EL layer and formed to be shared by a plurality of pixels; and a second insulating substrate for sealing provided so as to cover the opposite electrode,
wherein a thin-film transistor having a semiconductor film, a source electrode, a drain electrode and a gate electrode and supplying a display signal to the pixel electrode is provided on the first insulating substrate, and
the semiconductor film includes first semiconductor islands formed on a surface of the first insulating substrate, semiconductor crystal nuclei formed on surface portions of the first semiconductor islands, and a second semiconductor film formed on the semiconductor crystal nuclei.

15. The display apparatus according to claim 14,
wherein the first semiconductor islands are made of amorphous silicon or microcrystalline silicon.

16. The display apparatus according to claim 14,
wherein the semiconductor crystal nuclei are made of silicon germanium crystal nuclei.

17. The display apparatus according to claim 14,
wherein the second semiconductor film is made of a polycrystalline silicon film or a polycrystalline silicon germanium film.

18. The display apparatus according to claim 14, further comprising:
a third semiconductor film formed on the second semiconductor film.

19. The display apparatus according to claim 18,
wherein the third semiconductor film is made of an amorphous silicon film, a microcrystalline silicon film, or a polycrystalline silicon film.

20. A display apparatus comprising: a plurality of pixel electrodes formed on a first insulating substrate; a second insulating substrate in which a color filter layer, an overcoat layer, an opposite electrode made of an ITO film and an alignment film are sequentially formed; and liquid crystal injected to a space between the first insulating substrate and the second insulating substrate attached to each other,
wherein a thin-film transistor having a semiconductor film, a source electrode, a drain electrode and a gate electrode and supplying a display signal to the pixel electrode is provided on the first insulating substrate, and
the semiconductor film includes first semiconductor islands formed on a surface of the first insulating substrate, semiconductor crystal nuclei formed on surface portions of the first semiconductor islands, and a second semiconductor film formed on the semiconductor crystal nuclei.

* * * * *